(12) United States Patent
Little et al.

(10) Patent No.: US 10,553,966 B1
(45) Date of Patent: Feb. 4, 2020

(54) WIRE ARRANGEMENT WITH GROUND STAPLES ON PRINTED CIRCUIT BOARD

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventors: Terrance F. Little, Fullerton, CA (US); Patrick R. Casher, North Aurora, IL (US)

(73) Assignees: FOXCONN (KUNSHAN) COMPUTER CONNECTOR CO., LTD., Kunshan (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 16/520,877

(22) Filed: Jul. 24, 2019

Related U.S. Application Data

(60) Provisional application No. 62/702,884, filed on Jul. 24, 2018.

(51) Int. Cl.
| | | |
|---|---|---|
| *H01R 12/53* | (2011.01) | |
| *H01R 12/58* | (2011.01) | |
| *H05K 1/18* | (2006.01) | |
| *H05K 1/11* | (2006.01) | |

(52) U.S. Cl.
CPC ............ *H01R 12/53* (2013.01); *H01R 12/58* (2013.01); *H05K 1/18* (2013.01); *H05K 1/117* (2013.01); *H05K 2201/10356* (2013.01); *H05K 2201/10393* (2013.01); *H05K 2201/10522* (2013.01); *H05K 2201/10545* (2013.01)

(58) Field of Classification Search
CPC .......... H01R 12/53; H01R 12/58; H05K 1/18; H05K 2201/10356; H05K 1/117; H05K 2201/10545; H05K 2201/10393; H05K 2201/10522
USPC ........................................................ 174/250
See application file for complete search history.

(56) References Cited

U.S. PATENT DOCUMENTS

| | | | |
|---|---|---|---|
| 8,840,432 B2 | 9/2014 | Tyco | |
| 9,203,193 B2 | 12/2015 | Tyco | |
| 9,306,334 B2 * | 4/2016 | Zhu | ...................... H05K 1/0219 |
| 9,373,915 B1 * | 6/2016 | Schulz | ............... H01R 13/6594 |
| 9,490,588 B2 | 11/2016 | Molex | |
| 9,859,659 B2 | 1/2018 | Molex | |

(Continued)

OTHER PUBLICATIONS

QDFP-DD Specification for QSFP Double Density 8X Pluggable Transceiver Rev 0.1 Mar. 8, 2016.

*Primary Examiner* — Sherman Ng
(74) *Attorney, Agent, or Firm* — Wei Te Chung; Ming Chieh Chang

(57) ABSTRACT

The QSFP-DD module has an internal printed circuit board defining a mating port at a front edge region, and a connecting port at a rear edge region, and plural sets of wires mechanically and electrically connected to the connecting port with a plurality of ground staples discrete from one another to secure the respective sets of wires to the printed circuit board. The pitch among the ground staples is essentially 3.38 mm, and the wires are connected to two opposite surfaces of the printed circuit board with the associated ground staples. The staples are arranged in rows along the transverse direction.

19 Claims, 16 Drawing Sheets

(56) References Cited

U.S. PATENT DOCUMENTS

| | | | |
|---|---|---|---|
| 2002/0112878 A1* | 8/2002 | Ishizawa | B41J 2/17503 174/250 |
| 2010/0210142 A1* | 8/2010 | McGrath | H01R 12/594 439/620.22 |
| 2013/0280955 A1* | 10/2013 | Alden, III | H01R 13/648 439/607.28 |
| 2017/0040746 A1* | 2/2017 | Zhang | H01R 12/594 |
| 2017/0294721 A1* | 10/2017 | Pao | H01R 4/023 |
| 2018/0287280 A1* | 10/2018 | Ratkovic | H01R 12/596 |

* cited by examiner

WIRE ARRANGEMENT WITH GROUND STAPLES ON PRINTED CIRCUIT BOARD

BACKGROUND OF THE INVENTION

1. Field of the Invention

The invention relates to an electrical connector assembly, and particularly to a set of wires arranged upon a printed circuit board with corresponding ground staples.

2. Description of Related Art

Currently QSFP-DD Specification Rev. 0.1 discloses a 1×1 QSFP-DD module has eight electrical lanes. Each of the eight electrical lanes of the QSFP runs at the rate of 25 Gbit/s or 50 Gbit/s, whereby the QSFP-DD module support 200 Gbit/s or 400 Gbit/s Ethernet applications of. Typically, the QSFP-DD module has an internal printed circuit board defining a mating port at a front edge region, and a connecting port at a rear edge region, and plural sets of wires mechanically and electrically connected to the connecting port with a unitary ground bar extending along the transverse direction to secure the respective sets of wires to the printed circuit board. Such a ground bar extends unitarily in the transverse direction in a zigzag manner for forming a plurality of hidden passages for holding the corresponding sets of wires, i.e, the rear row wires, which is essentially sandwiched between the printed circuit board and the ground bar, and a plurality of exposed passages for allowing the corresponding sets of wires, i.e., the front row wires, to extend therethrough in the front-to-back direction, wherein the plurality of hidden passages and the plurality of exposed passages are alternately with each other in the transverse direction. Because of the unitary zigzag structure of the ground bar along the transverse direction which inevitably forms the space occupying transmission region between the neighboring hidden passage and exposed passage, and the minimum required dimension/diameter of the sets of the wires is pre-determined, it is relatively hard to shorten the ground bar dimension in the transverse direction and minimize the width of the printed circuit board.

In a traditional arrangement, the pitch between the two neighboring exposed passages is around 3.75 mm which is shown in FIG. 6. Anyhow, because the QSFP-DD modules are mostly side by side arranged with one another in the transverse direction, it is desired to have the less width on the QSFP-DD module for easy operation of the densely side by side arranged QSFP-DD modules. Accordingly, the pitch between every adjacent two hidden passages is also required to be decreased to be smaller than 3.75 mm correspondingly.

SUMMARY OF THE INVENTION

An object of the present invention is to provide a plurality of discrete ground staples instead of the unitary ground bar for achieving the pitch between every adjacent two hidden passages less than 3.75 mm, thus lessening and minimizing the width of the printed circuit board for easy arranging and manufacturing the QSFP-DD module.

According to the invention, the QSFP-DD module has an internal printed circuit board defining a mating port at a front edge region, and a connecting port at a rear edge region, and plural sets of wires mechanically and electrically connected to the connecting port with a plurality of ground staples discrete from one another to secure the respective sets of wires to the printed circuit board. The pitch among the ground staples is essentially 3.38 mm, and the wires are connected to two opposite surfaces of the printed circuit board with the associated ground staples. The staples are arranged in rows along the transverse direction. On one hand, on the same surface of the printed circuit board, the staples in one/a first row are not aligned with, in the front-to-back direction, but offset from, along the transverse direction, those in another/a second row; on the other hand, on opposite first and second surfaces of the printed circuit board, the staples in one row on the first surface are aligned, in the vertical direction, with those in another row on the second surface. Notably, the pitch 3.38 mm among the ground staples allows densely arrangement of the sets of wires in the transverse direction, thus efficiently minimizing the width of the printed circuit board.

The ground staple on the first surface and the corresponding ground staple on the second surface which are aligned with each other in the vertical direction, are deemed to be paired. The staple includes two mounting legs on two opposite lateral sides in an offset manner so as to allow the paired staples to be able to be respectively mounted upon the opposite first surface and second surface without interference upon the corresponding mounting legs. On the same surface of the printed circuit board, the staples in the first row are integrally formed on a same first carrier, and the staples in the second row are integrally formed on another same second carrier wherein the first carrier and the second carrier are linked on the outer sides of the corresponding staples, respectively, in an opposite manner so as not to interfere with each other during assembling upon the same surface of the printed circuit board.

Other objects, advantages and novel features of the invention will become more apparent from the following detailed description when taken in conjunction with the accompanying drawings.

DETAILED DESCRIPTION OF THE PREFERRED EMBODIMENT

Figure 1A:
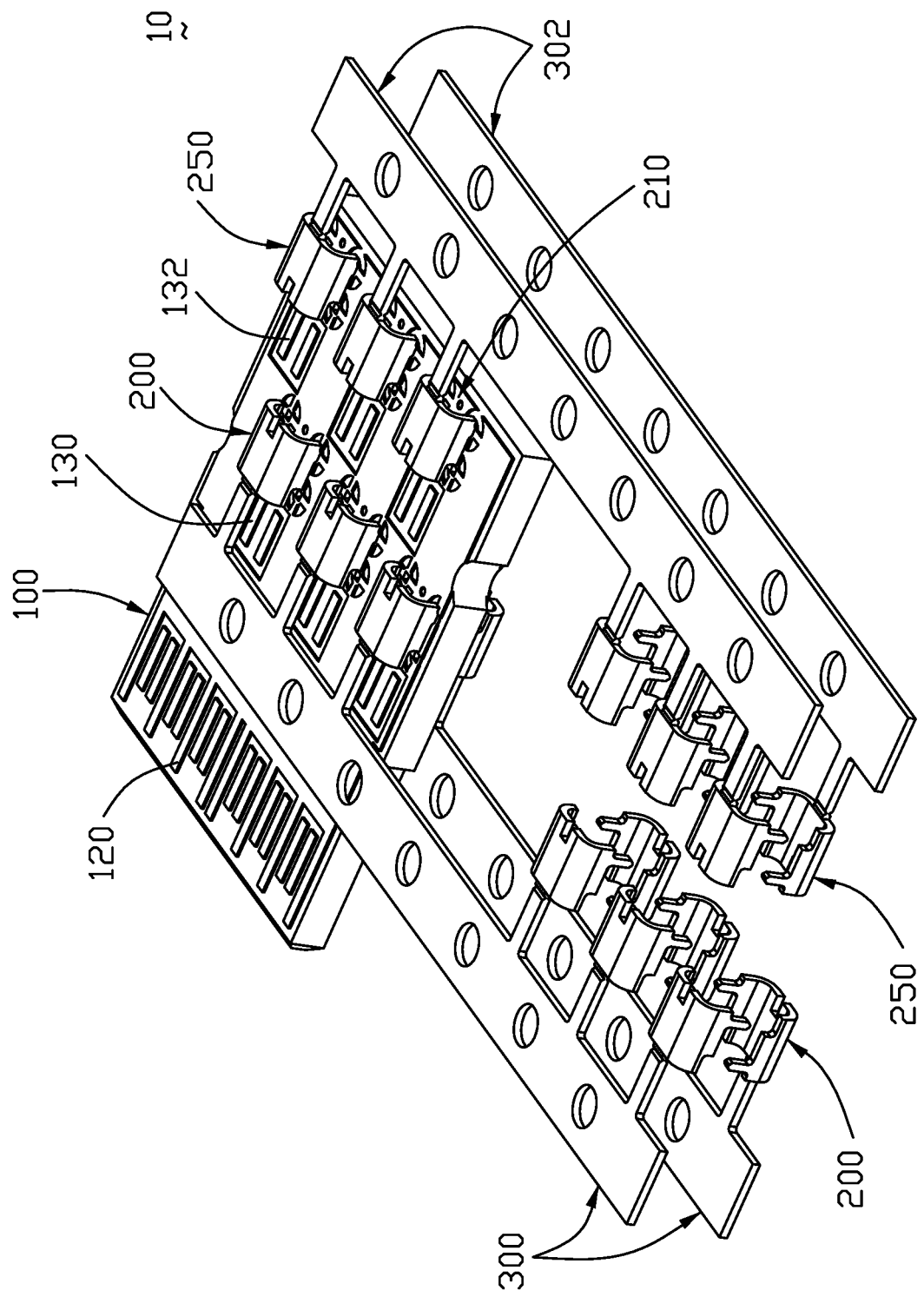
FIG. 1(A) is a rear downward perspective view of the ground staples with the corresponding carriers and one corresponding printed circuit board according to the invention.
Figure 1B:
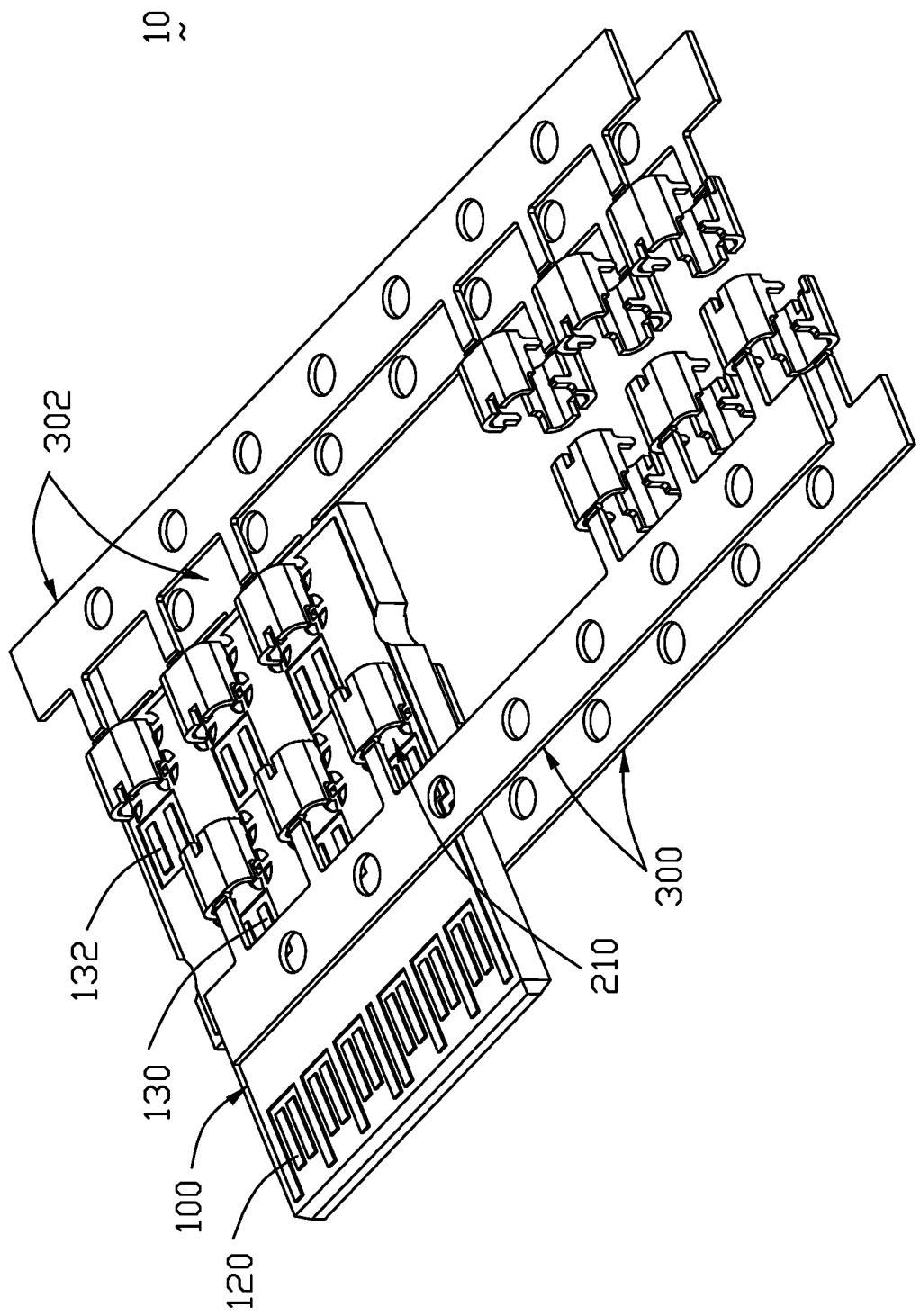
FIG. 1(B) is a front downward perspective view of the ground staples with the corresponding carriers and one corresponding printed circuit board of FIG. 1(A)
Figure 1C:
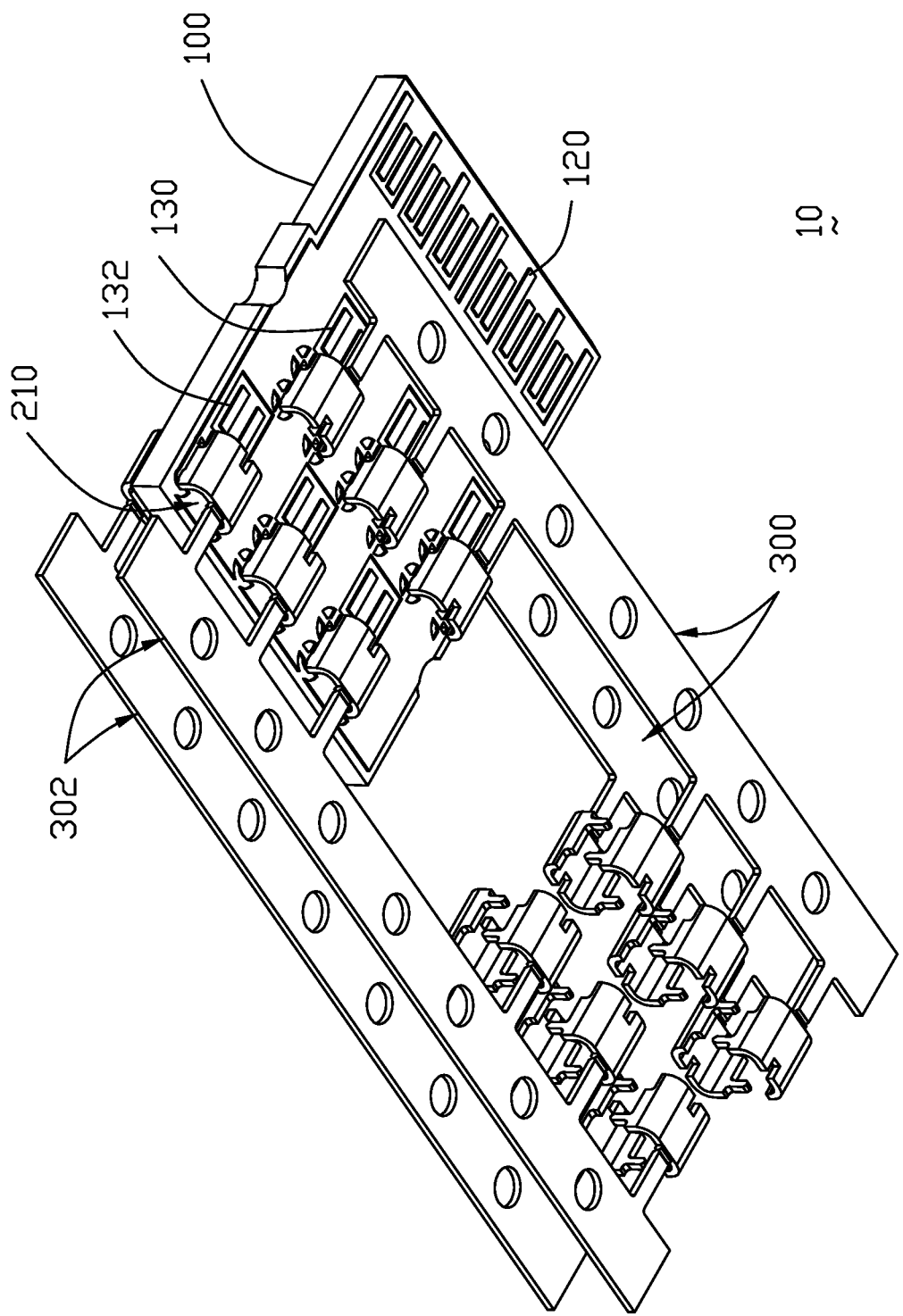
FIG. 1(C) is rear upward perspective view of the ground staples with the corresponding carriers and one corresponding printed circuit board of FIG. 1(B)
Figure 2:
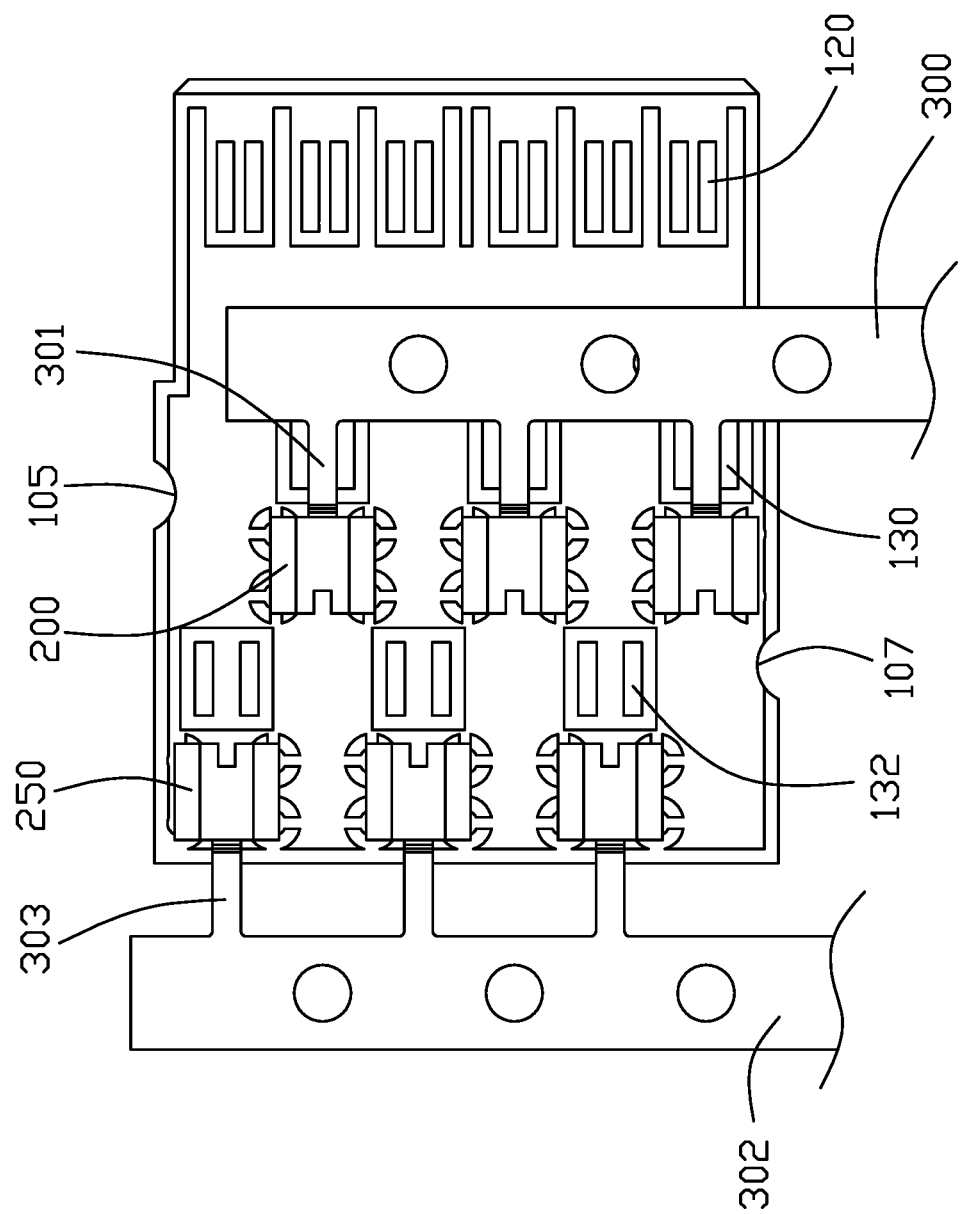
FIG. 2 is a bottom view of the ground staples with the corresponding carriers and one corresponding printed circuit board of FIG. 1(C)
Figure 3A:
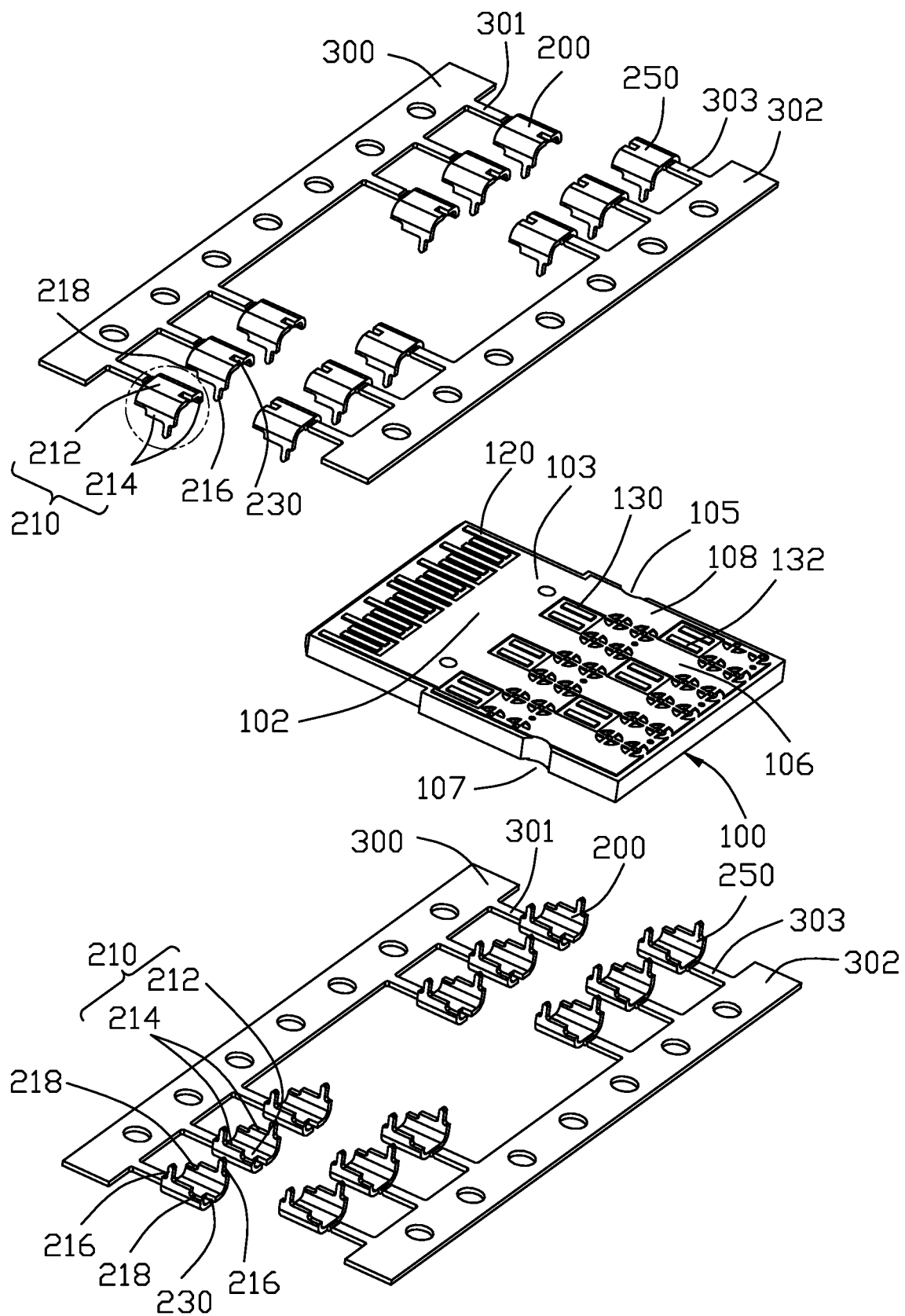
FIG. 3(A) is a rear downward exploded perspective view of the staples with the corresponding carriers and one corresponding printed circuit board of FIG. 1(A)
Figure 3B:
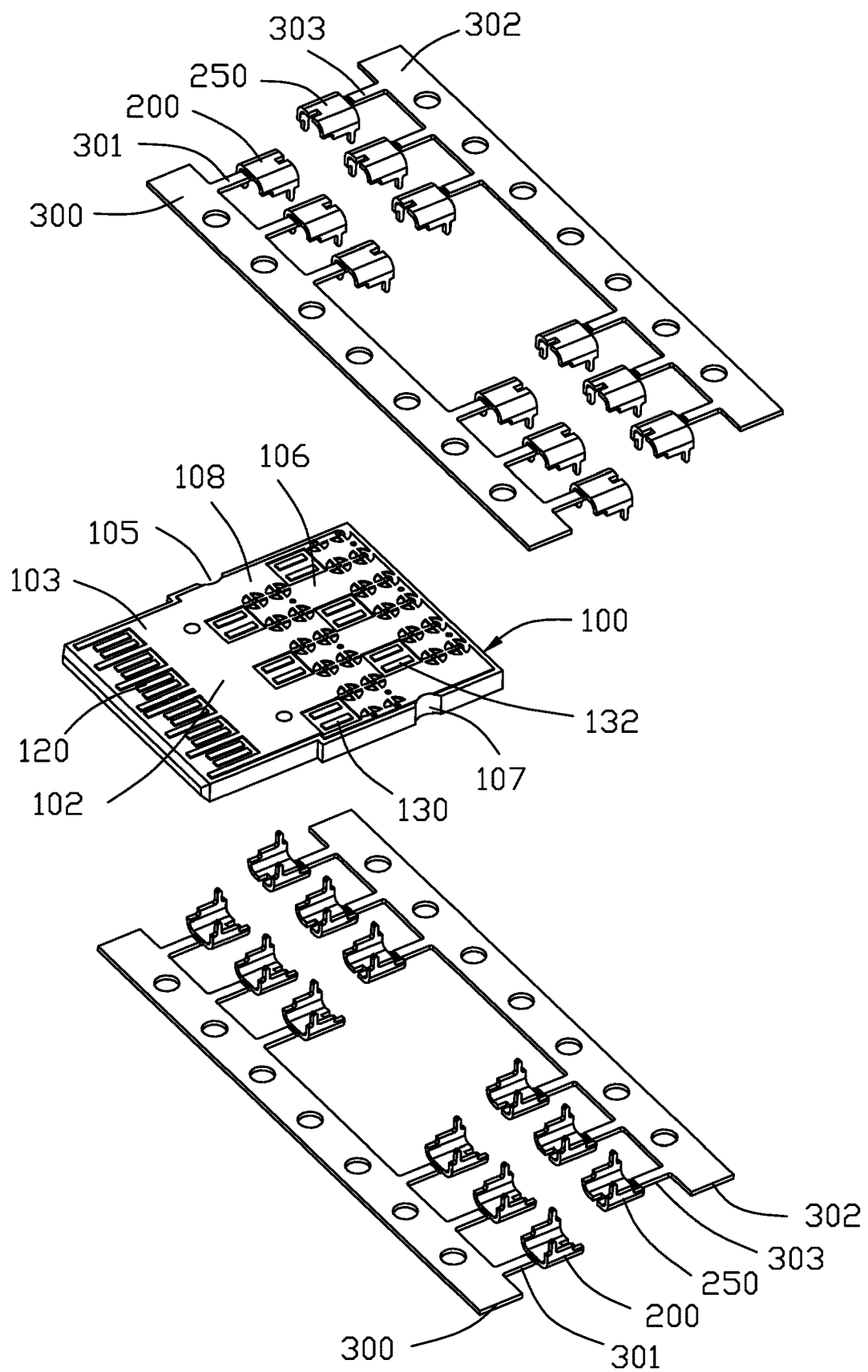
FIG. 3(B) is a front downward exploded perspective view of the staples with the corresponding carriers and one corresponding printed circuit board of FIG. 1(B)
Figure 3C:
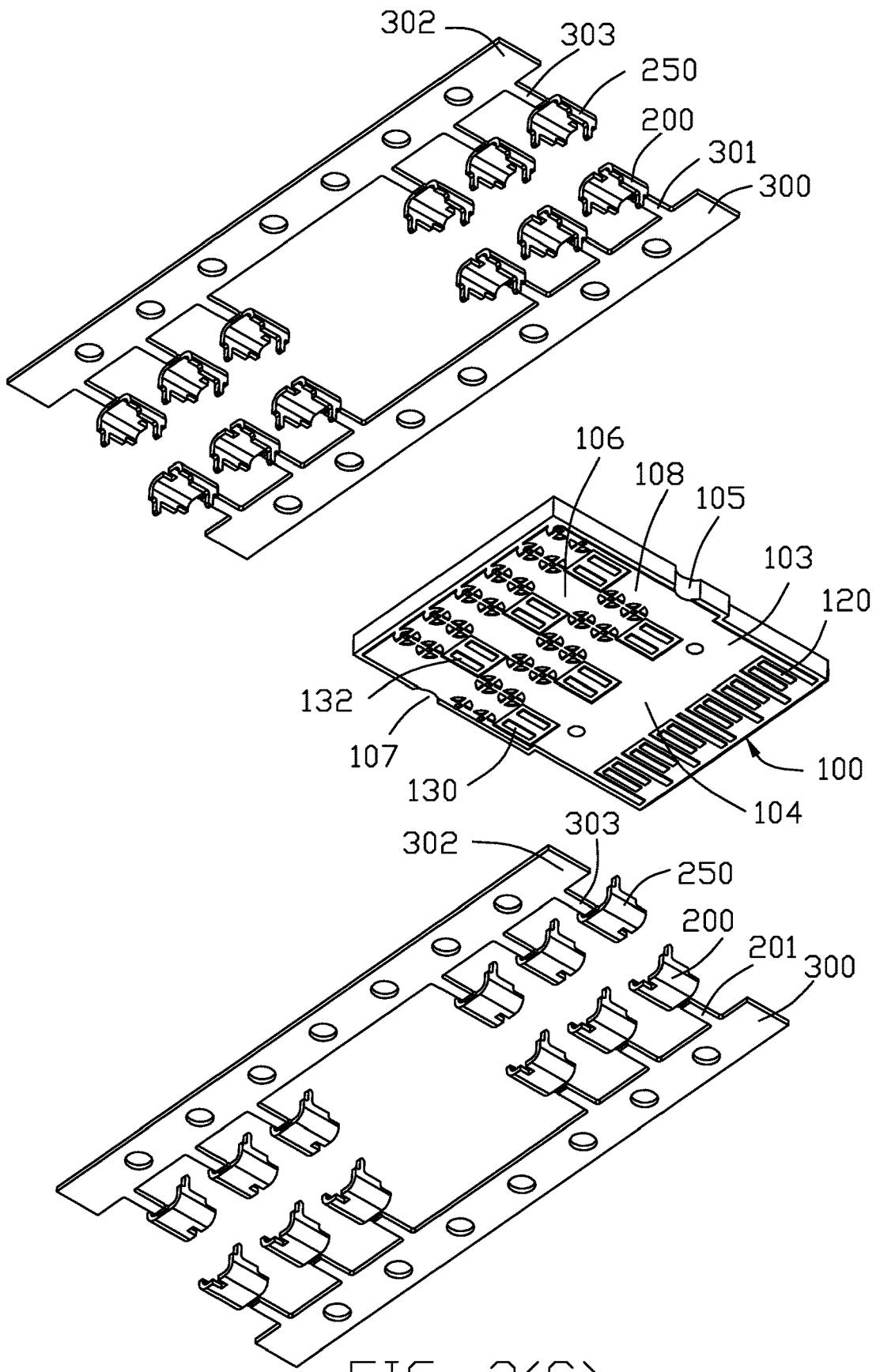
FIG. 3(C) is a rear upward exploded perspective view of the staples with the corresponding carriers and one corresponding printed circuit board of FIG. 1(C)
Figure 4:
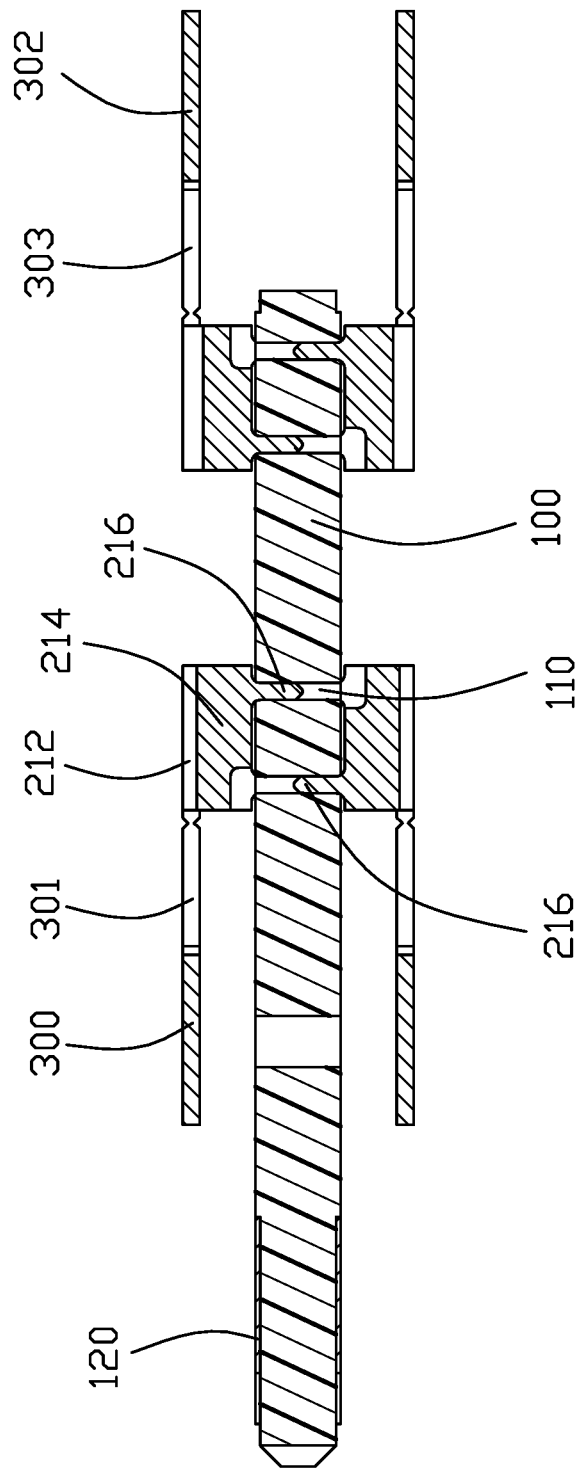
FIG. 4 is a cross-sectional view of the staples with the corresponding carriers and one corresponding printed circuit board of FIG. 1(A)
Figure 5:
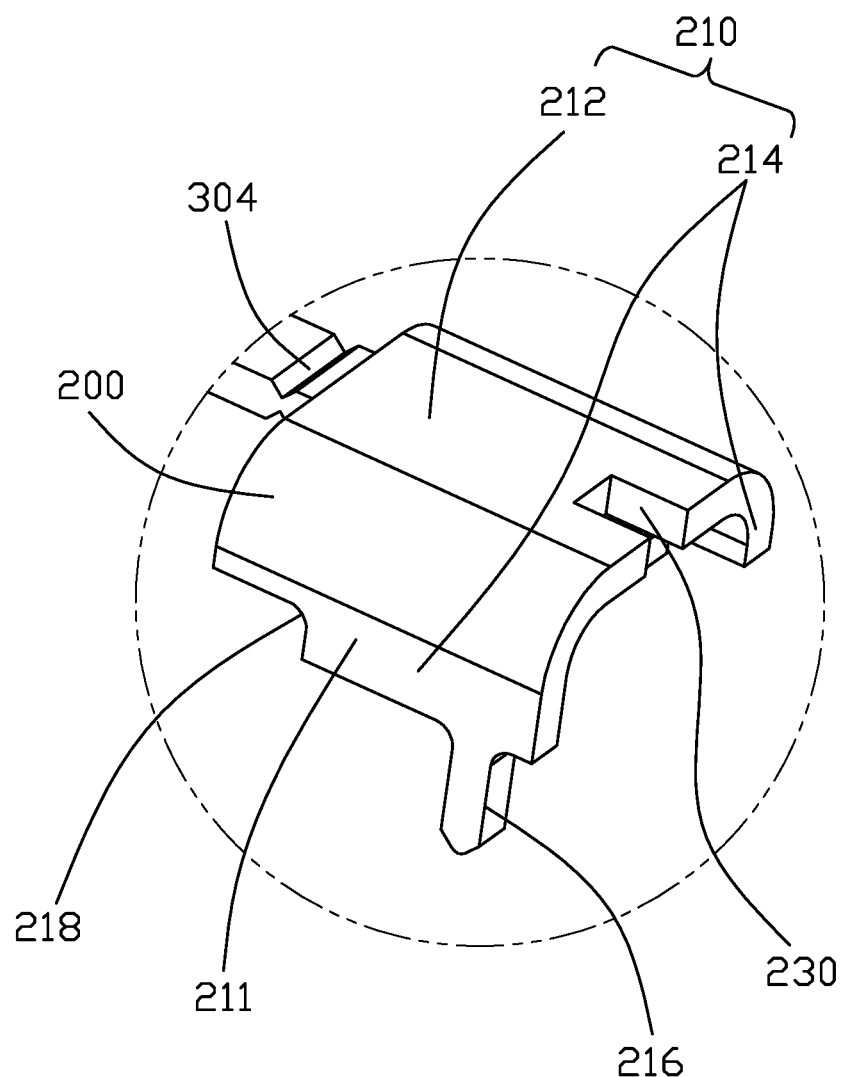
FIG. 5 is an enlarged perspective view of the staple of FIG. 3(A)
Figure 6:
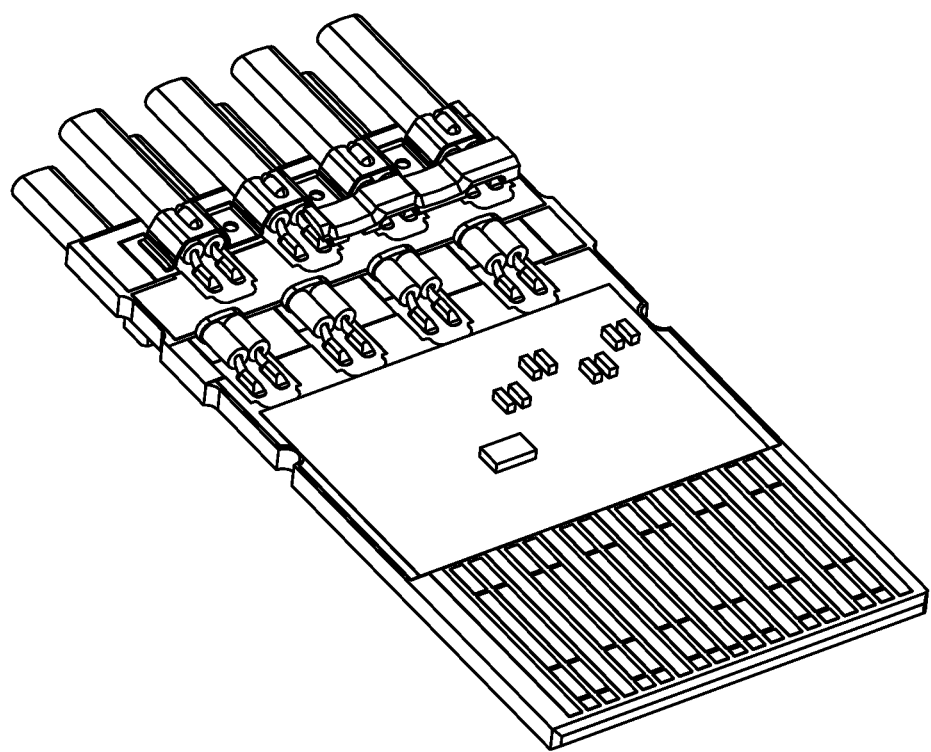
FIG. 6 is a perspective view of the printed circuit board with the traditional ground bar thereon having a 3.75 mm pitch thereof.

Referring to FIGS. 1(A) to 5, an internal printed circuit board assembly 10 includes a printed circuit board 100 with opposite first/top surface 102 and second/bottom surface 104, and a plurality of metallic staples 200, 250 thereon. A front notch 105 and a rear notch 107 are formed in the corresponding two side edges of the printed circuit board 100 for assembling orientation consideration. On each of the top surface 102 and the bottom surface 104 of the printed circuit board 100, one row of conductive mating pads 120 along the transverse direction are formed on a front edge region 103 of the printed circuit board 100, a front row of conductive connecting pads 130 along the transverse direction are formed on a middle region 108 of the printed circuit board 100, and a rear row of conductive connecting pads 132 along the transverse direction are formed on a rear edge region 106 of the printed circuit board 100. A front row of staples 200 are assembled to the middle region of the printed circuit board 100 and located behind the front row of conductive connecting pads 130 in the front-to-back direction, respectively. A space 210 is formed between each staple 200 and the printed circuit board 100 for receiving a differential pair of wires (not shown). Each of the staples 200 includes an upside-down U-shaped body 211 having a base 212 and two opposite side walls 214 on two opposite sides. Each of the side walls 214 has one mounting leg 216 extending through the corresponding through hole 110 in the printed circuit board 100, and the mounting legs 216 of the two side walls 214 are arranged in a diagonal manner with each other. A recess 218 is formed in each of the side wall 214 opposite to the corresponding mounting leg 216. The recess 218 is formed before the staple 200 is deformed to be of the U-shaped body 211. The pair of recesses 218 in the corresponding side walls 214 of the front row of staples 200 on the top surface 102 are aligned with the pair of recesses 218 in the corresponding side walls 214 of the front row of staples 200 on the bottom surface 104 in the vertical direction. A notch 230 is formed in one edge of each staple 200 for receiving a drain wire of the differential pair of wires therein. Similar to the front row of staples 200, the rear row of staples 250 are mounted to the printed circuit board 100 and located behind the corresponding rear row of conductive connecting pads 132 in the front-to-back direction, respectively. The structure of each of the rear row of staples 250 is same with that of each of the front row of staples 200 without redundant illustration. The front row of staples 200 are originally unitarily formed on a front carrier 300 via linking parts 301 at the corresponding front edges opposite to the corresponding notches 230, and the rear row of staples 250 are originally unitarily formed on a rear carrier 302 at the corresponding rear edges via linking parts 303 opposite to the corresponding notches 230. Anyhow, after assembled, both the front carrier 300 and the rear carrier 302 are removed via the associated V-cut structures 304 thereof.

One important feature of the invention is that because the staples 200, 250 are commonly mounted upon both top and bottom surfaces 102, 104 of the printed circuit board 100, the staples 200, 250 on the top surface 102 and the staples 200, 250 on the bottom surface 104 are required to be in an offset manner with each other for not interfering with each other. The front row of staples 200 on the top surface 102 are aligned with the front row of staples 200 on the bottom surface 104 in the vertical direction essentially in a mirror image arrangement except the mounting legs 216 of the front row of staples 200 on the top surface 102 are offset from those of the front row of staples 200 on the bottom surface 104 in said front-to-back direction for not interfering with each other. In this embodiment, the recess 218 of the staple 200, 250 on the top surface 102 is adapted to receive the mounting leg 216 of the corresponding staple 200 on the bottom surface 104 if the mounting leg 216 is longer than the thickness of the printed circuit board 100, and vice versa. This is the reason why the mounting legs 216 and the corresponding recesses 218 of the two side walls are required to be in an offset manner along the diagonal direction. Notably, in this embodiment the staples 200, 250 on the top surface 102 are aligned with those on the bottom surface 104 in the vertical direction, respectively. Anyhow, if applicable, the staples 200, 250 on the top surface 102 and those on the bottom surface 104 may be offset from each other in the front-to-back direction, respectively.

Another feature of the invention is to have the carrier 300 linked to front edges of the corresponding staples 200 while having the carrier 302 linked to rear edges of the corresponding staples 250. Under such arrangement, there is no interference between the carrier 300 and the carrier 302 during assembling the corresponding staples 200 and 250 upon the same top surface 102 or the same bottom surface 104. Because of this opposite arrangement, the notch 230 of the staple 200, which should be opposite to the corresponding linking part 301, is located at the rear edge thereof while the notch 230 of the staple 250, which should be opposite to the corresponding linking part 303, is located at the front edge thereof. The notches 230 of the front row of staples 200 are rearwardly directed while the notches 230 of the rear row of staples 250 are forwardly directed. Understandably, the differential pair of wires, which is restrained under the corresponding staple 200, 250, has the corresponding internal signal conductor mechanically and electrically connected to the connecting pads 130, 132, and a drain wire retained in the corresponding notch 230.

It is also noted that associated with the carrier 300, 302, the recess 218 of the staple 200, 250 is to correspond to the mount leg 216 of the neighboring staple 200, 250 in the transverse direction for allowing dense arrangement of the staples 200, 250 on the corresponding carrier 300, 302 with a 3.38 mm pitch that helps with the density of the twin-axes and routing, gives a reduced width printed circuit board 100. In addition, each the front row of staples 200 and the rear row of staples 250 is same with one another disregarding on the same surface or not, so that the same manufacturing mold can be used for saving cost.

It is noted that the staples 200 and the staples 250 are staggered with each other along the transverse direction wherein the two neighboring staples 250 leave a space therebetween to allow a differential pair of wires to extend therein to reach the corresponding staple 200.

Figure 7:
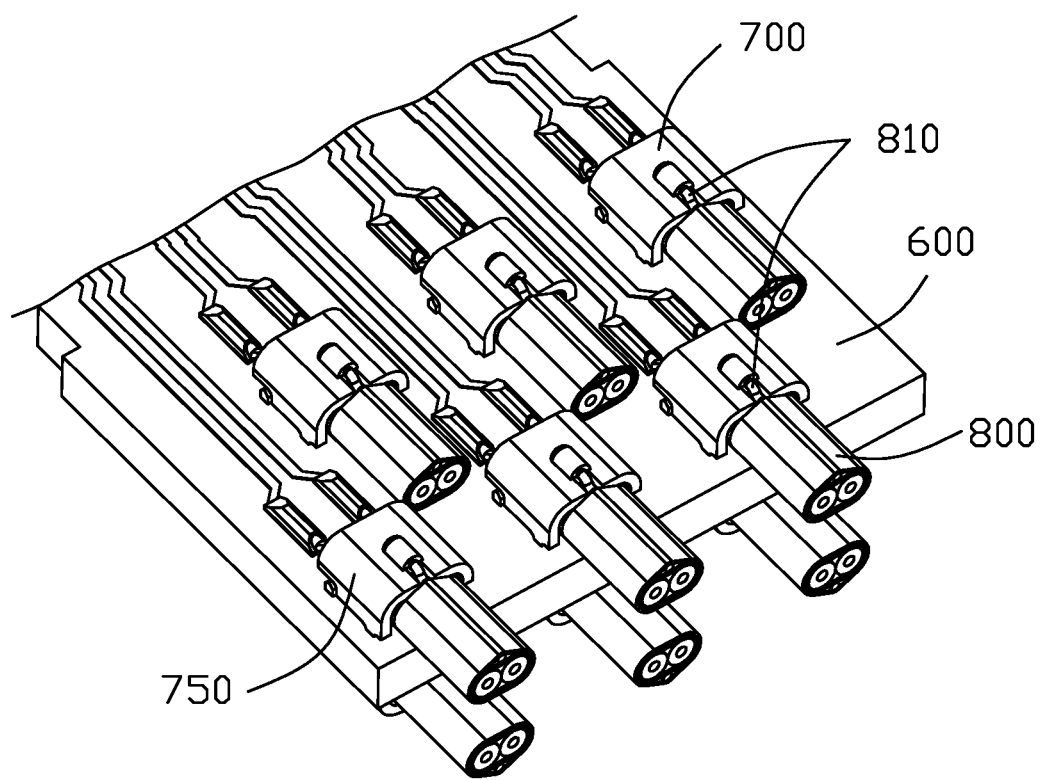
FIG. 7 shows a portion of the printed circuit board assembly with the corresponding staples and differential pairs of wires according to the second embodiment of the invention which is very similar to the first embodiment disclosed in FIGS. 1-5 except the notch position of the staple in the rear row.
Figure 8:
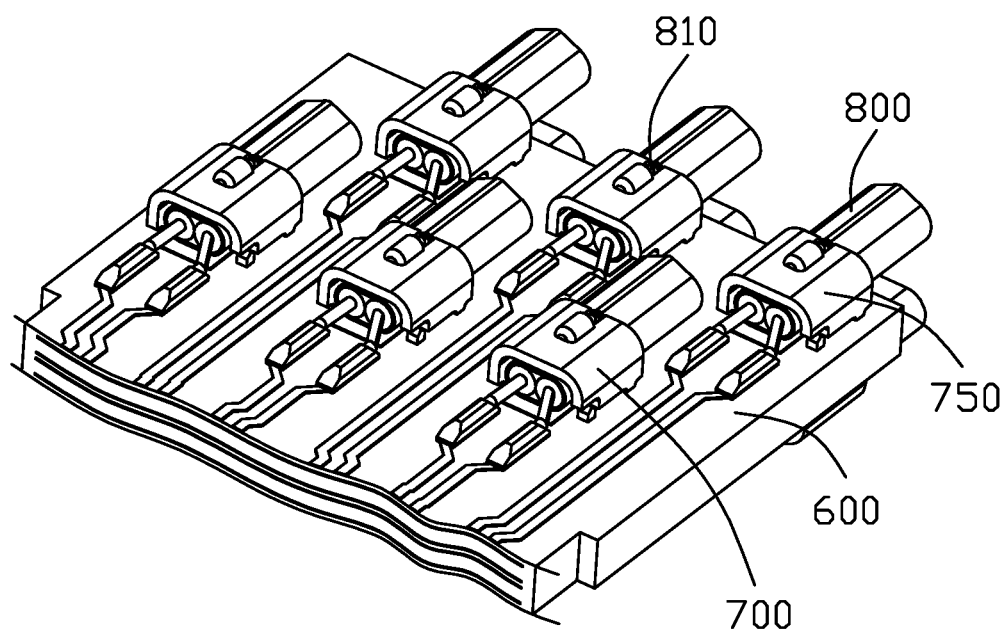
FIG. 8 shows a perspective view of the of the printed circuit board assembly of FIG. 7.
Figure 9:
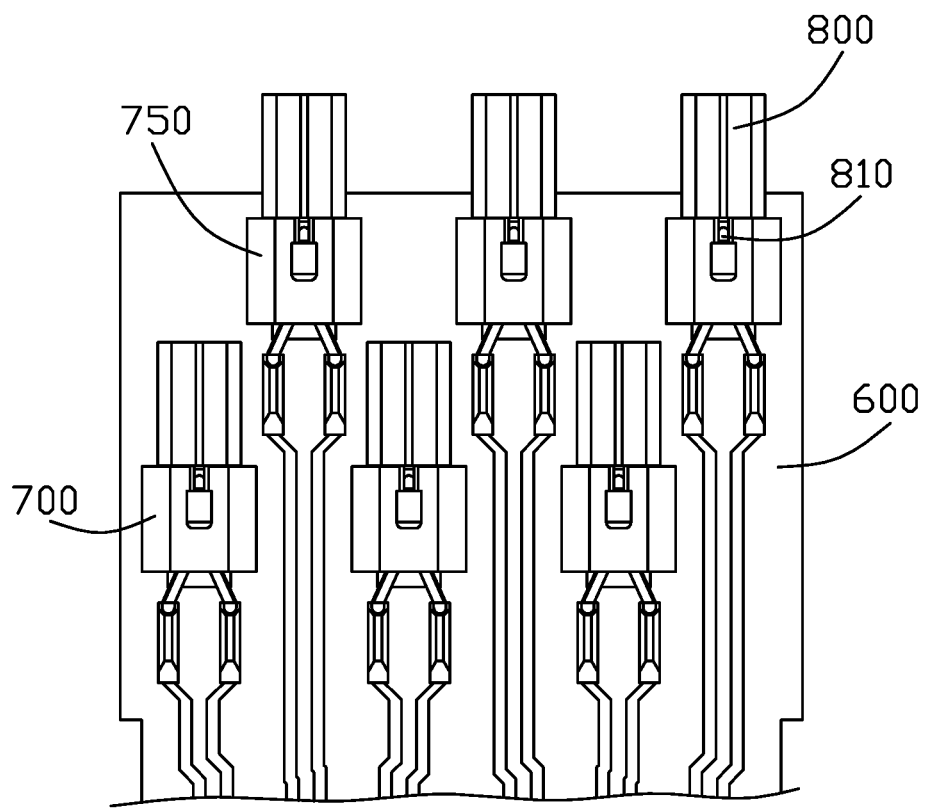
FIG. 9 shows a top view of the printed circuit board assembly of FIG. 8.
Figure 10:
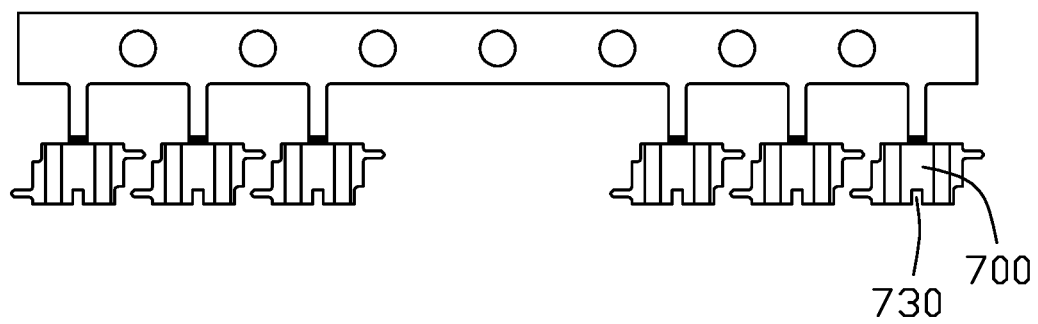
FIG. 10 shows a top view of the staples with the corresponding carrier before the forming of the staples.
Figure 11:
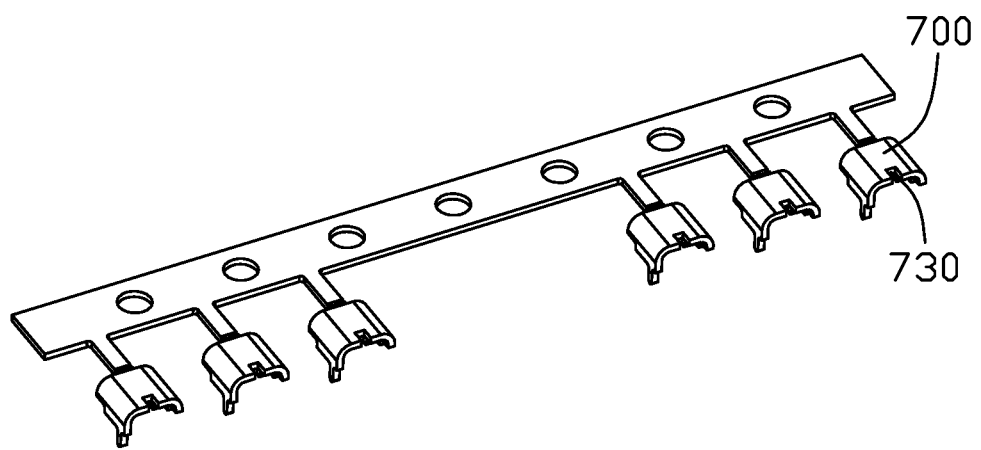
FIG. 11 shows the staples with the corresponding carrier after the forming of the staples.
Figure 12:
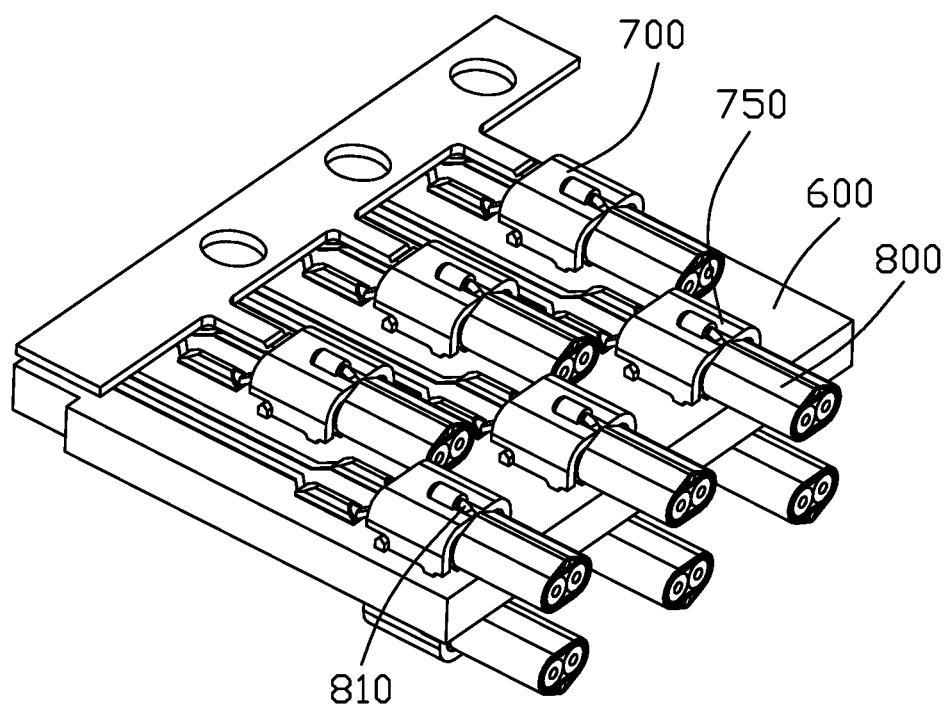
FIG. 12 shows how the carrier could be removed from the corresponding staples via the corresponding V-cut structures thereof.

FIGS. 7 to 12 show another embodiment of an internal printed circuit board assembly 60 similar to the internal printed circuit board assembly 10 the first embodiment of FIGS. 1(A) to 5. The main difference between the two embodiments of the internal printed circuit board assembly 10, 60 is the notches 730 of the front row of staples 700 and the rear row of staples 750 disposed at same sides. In this embodiment, the differential pair of wires 800 are shown connected with the printed circuit board 600 with drain wires 810 received in the notches 730 of the front row of staples 700, the rear row of staples 750.

What is claimed is:

1. A printed circuit board assembly comprising: a printed circuit board including two opposite top surface and bottom surface thereof in a vertical direction; one row of conductive mating pads and front and rear rows of conductive connecting pads formed on each of said top surface and said bottom surface, each row extending along a transverse direction perpendicular to the vertical direction while said rows being spaced from one another along a front-to-back direction perpendicular to both the vertical direction and the transverse direction; and on each of said top surface and said bottom surface, a front row of staples and a rear row of staples being arranged in a staggered manner along said transverse direction; wherein the front row of staples are discrete from one another in the transverse direction, and the rear row of staples are discrete from one another in the transverse direction; wherein a space is defined between each of said staples and the printed circuit board for snugly receiving a differential pair of wires therein.

2. The printed circuit board assembly as claimed in claim 1, wherein the front row of staples are originally connected with one another via a front carrier linked to front edges of the front row of staples via a front linking part, and the row of staples are originally connected with one another via a rear carrier linked to rear edges of the rear row staples via a rear linking part.

3. The printed circuit board assembly as claimed in claim 2, wherein each of said front row of staples and said rear row of staples forms a notch opposite to the corresponding linking part in the front-to-back direction for receiving a drain wire of the differential pair of wires.

4. The printed circuit board assembly as claimed in claim 3, wherein the notches of the front row of staples are rearwardly directed while the notches of the rear row of staples are forwardly directed.

5. The printed circuit board assembly as claimed in claim 1, wherein the front row of staples on the top surface are aligned with the front row of staples on the bottom surface in the vertical direction essentially in a mirror image arrangement except the mounting legs of the front row of staples on the top surface are offset from those of the front row of staples on the bottom surface in said front-to-back direction for not interfering with each other.

6. The printed circuit board assembly as claimed in claim 1, wherein a pitch of the front row of staples and that of the rear row of staples are both 3.38 mm.

7. The printed circuit board assembly as claimed in claim 1, wherein each of said staples includes a U-shaped body with a base and two side walls, and a pair of mounting legs are formed on the corresponding side walls, respectively, in an offset manner.

8. The printed circuit board assembly as claimed in claim 7, wherein each of staples further includes a pair of recesses in the corresponding side walls, respectively for corresponding to one corresponding mounting leg in the transverse direction before the staples are deformed to be of the U-shaped body.

9. The printed circuit board assembly as claimed in claim 8, wherein the pair of recesses in the corresponding side walls of the front row of staples on the top surface are aligned with the pair of recesses in the corresponding side walls of the front row of staples on the bottom surface in the vertical direction.

10. The printed circuit board assembly as claimed in claim 1, wherein said printed circuit board forms a pair of notches on two opposite side edges in an offset manner along the front-to-back direction for orientation consideration.

11. A method of making a printed circuit board assembly, comprising steps of: providing a printed circuit board with opposite top surface and bottom surface in a vertical direction; defining a front region, a rear region and a middle region therebetween in a front-to-back direction perpendicular to said vertical direction on each of said top surface and said bottom surface; providing a front row of staples linked by a front carrier via a front linking part at front edges of said front row of staples, and providing a rear row staples linked by a rear carrier via a rear linking part at rear edges of said rear row of staples; mounting said front row of staples and said rear row of staples upon the top surface; providing another front row of staples linked by another front carrier via another front linking part at front edges of said another front row of staples, and providing another rear row of staples linked by another rear carrier via another rear linking part at rear edges of said another rear row of staples; and mounting said another front row of staples and said another rear row of staples on the bottom surface; wherein each of said staples is configured to allow a differential pair of wires to extend therethrough in the front-to-back direction.

12. The method as claimed in claim 11, wherein the front row of staples and said another front row of staples are aligned with each other in the vertical direction.

13. The method as claimed in claim 11, wherein said front row of staples, said another front row of staples, said rear row of staples and said another rear row of staples all extend in a transverse direction perpendicular to both said vertical direction and said front-to-back direction, and a pitch of the staple in said transverse direction for all said front row of staples, said another front row of staples, said rear row of staples and said another rear row of staples are all around 3.38 mm.

14. The method as claimed in claim 11, wherein each of said staples in said front row of staples, said another front row of staples, said rear row of staples or said another rear row of staples defines a U-shaped body with a base and two side walls thereof, and the pair of side walls are equipped respectively with a pair of mounting legs in an offset arrangement in the front-to-back direction.

15. The method as claimed in claim 14, wherein each of said staples further includes a pair of recesses, respectively, in the corresponding pair of side walls in an offset manner in the front-to-back direction so as to have each of said side wall have one mounting leg and one recess.

16. A metallic staple for use with a printed circuit board, comprising: a U-shaped body with a base and a pair of side walls in a transverse direction; a pair of mounting legs extending respectively from the pair of side walls in an offset manner in a front-to-back direction perpendicular to said transverse direction; a pair of recesses formed respectively in the pair of side walls in the offset manner along the front-to-back direction so as to have each of said side walls have one corresponding mounting leg and one recess; and a notch formed in an edge of the base.

17. An assembly including a pair of staples each as claimed in claim 16, wherein said pair of staples are respectively mounted on two opposite surfaces of a printed circuit board, and the pair of mounting legs of one of said staples are respectively located within the pair of corresponding recesses of the other of said staples, and vice versa.

18. The staple as claimed in claim 16, wherein another edge of said base opposite to said edge is originally linked to a carrier via linking part.

19. An assembly including a front row of staples and a rear row of staples each as claimed in claim 18, wherein the carrier of the front row of staples are located in front of the front row of staples while the carrier of the rear row of staples are located behind the rear row of staples, and the notches of the front row of staples face rearwardly while the notches of the rear row of staples face forwardly.

\* \* \* \* \*